United States Patent [19]

Dorleijn et al.

[11] E Patent Number: Re. 32,545

[45] Reissued Date of Patent: Nov. 17, 1987

[54] MAGNETIC DOMAIN LOGIC DEVICE

[75] Inventors: Jan W. F. Dorleijn; Willem F. Druyvesteyn; Frederik A. De Jonge, all of Eindhoven, Netherlands

[73] Assignee: U.S. Philips Corporation, New York, N.Y.

[21] Appl. No.: 844,109

[22] Filed: Oct. 20, 1977

Related U.S. Patent Documents

Reissue of:

[64] Patent No.: 3,944,842
Issued: Mar. 16, 1976
Appl. No.: 478,575
Filed: Jun. 12, 1974

U.S. Applications:

[63] Continuation of Ser. No. 277,150, Aug. 2, 1972, abandoned.

[30] Foreign Application Priority Data

Aug. 3, 1971 [NL] Netherlands ..... 7110674

[51] Int. Cl.[4] ..... G11C 19/08

[52] U.S. Cl. ..... 365/32; 365/3

[58] Field of Search ..... 365/32, 3

[56] References Cited

U.S. PATENT DOCUMENTS

| | | | |
|---|---|---|---|
| 3,523,286 | 8/1970 | Bobeck et al. | 365/39 |
| 3,676,872 | 7/1972 | Lock | 365/32 |
| 3,996,571 | 12/1976 | Chang | 365/3 |

*Primary Examiner*—James W. Moffitt
*Attorney, Agent, or Firm*—Marc D. Schechter

[57] ABSTRACT

A magnetic device comprising a first and a second plate of a magnetic material between which domains are situated. An interaction force occurs between the domains in the two plates. Stable domain positions in a second plate define equally stable domain positions in a first plate. One or both plates can be provided with domain guiding structures. Domain displacement in one plate can control a domain displacement in the other so that a variation in the interaction force is produced.

13 Claims, 23 Drawing Figures

MAGNETIC DOMAIN LOGIC DEVICE

Matter enclosed in heavy brackets [ ] appears in the original patent but forms no part of this reissue specification; matter printed in italics indicates the additions made by reissue.

This is a continuation of application Ser. No. 277,150, filed Aug. 2, 1972, now abandoned.

The invention relates to a magnetic device comprising a first plate of a magnetic material in which at least one domain can be present. The said plate has a preferred magnetization direction which extends transverse to the plane of the plate. The rare-earth and yttriumorthoferrites are examples of materials which are suitable for this purpose. A said domain is an area in the plate which, if a field is applied transverse to the plate, has a magnetization which is opposed to the direction of the applied field. As is known, such a domain can have different shapes such as a circular or annular, strip-like etc. section.

A wide variety of proposals have been made so as to enable the use of such domains. To this end it must be possible to influence the domain in some manner. For example, there must be a variable field or a rotary field to enable displacement etc. of a domain along a strip of permalloy which is specially formed for this purpose. The invention has for its object to provide a very useful and simple extension of the possibilities of externally influencing a domain. To this end, the magnetic device according to the invention is characterized in that a second plate of magnetic material in which a domain can be present is provided, at least the projection of said second plate covering at least part of the first plate, an interaction force occurring between at least one domain in the first and one domain in the second plate. Consequently, this means that according to the invention domains influence each other; it must be emphasized that these domains are situated in different plates of magnetic material.

The plates will generally be arranged to be parallel with respect to each other so as to ensure that the interaction between a domain in a first plate and a domain which is present in a second plate directly thereabove or therebelow, is independent of the position of the domains in the plate.

Consequently, in the exmples hereinafter always a parallel plate arrangement is shown, even though the invention is not restricted thereto.

This principle of influencing can be used in a wide field of applications. This influencing can be used particularly advantageously in magnetic devices in which domains are to be displaced.

A magnetic device of the kind set forth in which a domain guiding structure is provided for displacing domains in the first plate according to a given trajectory according to the invention is characterized in that said second plate serves to create stable positions for domains in the first plate by means of domains situated in the second plate. It is to be noted that the use is known of an element in the form of a second, in this case nonmagnetic plate so as to create stable positions for domains in the first plate. However, this second plate then does not contain domains but separate magnets which are provided for this purpose in openings of the plate. It will be obvious that the use of domains in the second, i.e. magnetic, plate according to the invention offers advantages: domains can be readily generated therein and in principle no operations are required with or on the plate. This is because the domains will arrange themselves according to a given pattern in the second plate, depending on the number of domains and inter alia the thickness of the plate, so that a stable pattern of domains is produced which creates the said stable domain positions for domains in the first plate.

A further possibility of application of the principle of the invention for the displacement of domains is offered by a magnetic device which is characterized in that a domain guiding structure is provided in the second plate for displacement of domains according to a given trajectory, these displaceable domains in the second plate defining displaceable stable domain positions in the first plate.

A magnetic device of this kind offers a very interesting and simple method of displacing domains. The first plate, or first plates since there can be more than one, can contain information which can be stationary and displaceable, without a domain guiding structure and, for example, rotary or varying fields being required for this purpose. This is achieved by the presence of the said second plate according to the invention in which the said domain guiding structure is present and in which the domains, arranged according to the trajectory of this structure, define stable domain positions in the first plate (plates). If the domains in the second plate are displaced, the corresponding domains in the first plate (plates) are taken along. As the second plate will be completely filled with domains, the displacement of these domains can be very readily realized without a guiding structure of a special shape and special fields being required. For example, a further embodiment according to the invention is characterized in that the second plate is completely filled with domains along a guiding structure, domains in the second plate being displaced via means which exert a "pull-push" force on the domains, the displacement of domains in the first plate being determined by said displacement of the domains in the second plate. For example, the domain guiding structure can consist of a continuous strip of permalloy along which the domains travel, the domains being subjected to an external pull-push force which is generated, for example, by current pulses in wire loops which are provided at only one or at a few locations on the plate, their displacement also being stimulated by their mutual repulsion.

Elaborating on the foregoing, a combination is also possible where domain guiding structures are present for displacing domains in the first plate along given trajectories as well as for displacing domains in the second plate according to a given trajectory, a displacement of a domain in the second plate causing and controlling a displacement of domains according to one of the trajects in the first plate.

In particular with the latter configuration a magnetic device is obtained which is suitable for many purpose. The domains, displaceable along given trajects in the first plate, can be controlled by the domains in the second plate which are also displaceable along given trajectories. It is thus possible to realize logic functions as will be described hereinafter.

The dimensions of the domains in the said first and second plate are determined inter alia by the degree of influencing of a domain in the second plate by a domain in the first plate, and vice versa. This influencing is dependent on the distance between the two said plates at the area of the relevant domains. This distance is in principle variable from zero to infinity, the influencing then being maximum and zero, respectively. This fact can be used to good advantage. To this end, a further embodiment of the magnetic device according to the invention is characterized in that said first and second plate are displaceable with respect to each other, the dimensions of the domains in the plates thus being variable. A dimensional variation of this kind can be used, for example, for measuring distances, or variations therein, such as mechanical vibrations, by detection of said dimensional variation. The applicability, however, is wider still. This is because field variations, wich occur between the two plates in the case of a said displacement can cause domain displacements. A magnetic device according to the invention in which a structure for domain guiding is provided on at least one of the plates, consequently, is characterized in that said first and second plate are displaceable with respect to each other, a domain being displaceable in the direction of such a guiding structure as a result of a dimensional variation of the domain.

It is important to note that there need not always be an interaction between one domain in the first plate and one domain in the second plate, but that it is equally possible that an interaction exists between more than one domain in the first plate and one domain in the second plate, etc. A special example thereof is a device in which the second plate comprises a strip-like domain by means of which stable domain positions are defined in the first plate at the area of the projection of the ends of said strip-like domain.

The embodiments according to the invention are not restricted to configurations comprising only a single first and second plate, but there can also be a plurality of first and/or second plates of magnetic material in which domains can be present. It is also to be noted that the thicknesses of the plates may differ. A second plate preferably has a thickness which exceeds that of a first plate. This is due to the fact that the stabilizing effect provided by such a second plate is greater in that case, so that a plurality of first plates can benefit therefrom. The same can be noted with respect to the distance between a first and a second plate. In given cases this distance will be equal to 0.

This and other aspects of the invention will be described in detail in the description of the Figures which will be given hereinafter and which serves for the explanation of the invention.

FIG. 1 shows a domain in a first and in a second magnetic plate according to the invention, FIG. 2 is a sectional view of the arrangement of FIG. 1, FIGS. 3a [and] *to* 3f show a number of other feasible domain shapes in one or more first plates and one second plate according to the invention, FIGS. 4a and 4b show a plurality of domains in two plates and in more than two plates, respectively.

FIGS. 5a and 5b show a magnetic device according to the invention in which a domain guiding structure for domains in the first plate is provided, FIGS. 6a, 6b, 6c and 6d show a magnetic device according to the invention in which a domain guiding structure for domains in the second plate is provided, FIGS. 7 and 8 show magnetic devices according to the invention, comprising a domain guiding structure both for a first and for a second plate, FIGS. 9 and 10 show detailed domain guiding structures for use in the example shown in FIG. 8, FIG. 11 shows another example of a controllable displacement of domains.

Figure 1:
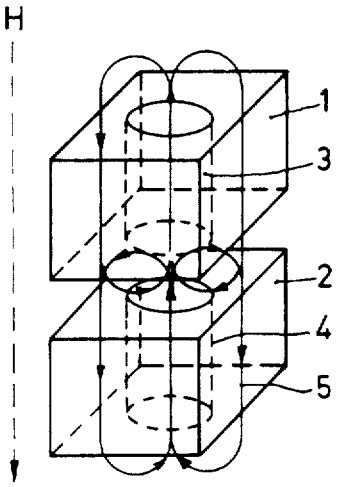

The reference numeral 1 in FIG. 1 denotes a first plate of a magnetic material, and the reference numeral 2 denotes a second plate of a magnetic material. In plate 1 a domain 3 is present, and plate 2 accommodates a domain 4. The plates have a preferred magnetization direction which extends transverse to the plane of the plates. A magnetic field H extends from the top downwards, transverse to the plates. Domains 3 and 4 can be generated, for example, by means of a current-carrying loop. The stray field of the domains is denoted by lines of force 5. The stray fields of the domains 3 and 4 interact, the interaction force occurring being larger as the distance between the plates 1 and 2 is smaller. It is to be noted that the dimensions of a domain in a plate are dependent on the thickness of the plate and the number of domains present in the plate. It is obvious that the said interaction force also influences the dimensions of the domains 3 and 4 in plates 1 and 2, respectively, in devices according to the invention.

Figure 2:
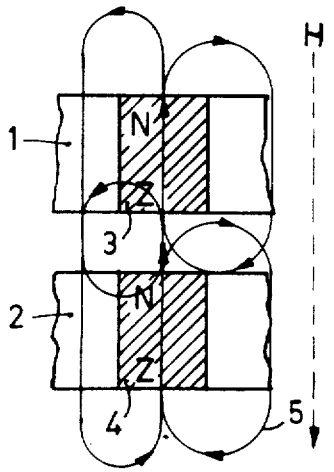

FIG. 2 is a sectional view of the arrangement of FIG. 1. It is shown how the domains 3 and 4 have north poles and south poles (N - Z), so that obviously mutual influencing exists, i.e. attraction occurs between the two domains in accordance with the shown configuration. If the domain 4 has a properly defined position in plate 2, this domain 4 will create, when said force of attraction exists, a stable domain position in plate 1, i.e. at the area where domain 3 is shown.

Figure 3A:
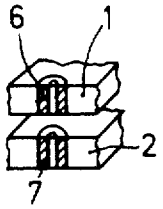
Figure 3B:
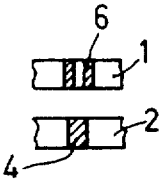
Figure 3C:
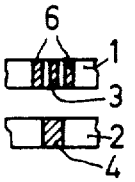
Figure 3D:
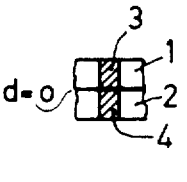
Figure 3E:
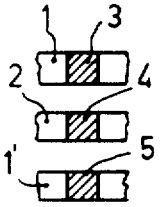
Figure 3F:
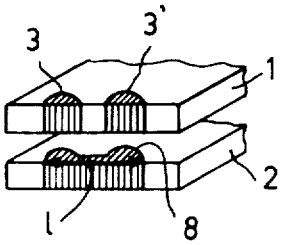

FIGS. 3a and 3f show a number of different feasible domain shapes in plates 1 and 2. The interaction occurs between domains which can have any shape feasible for domains. In all cases shown a force of attraction exists between oppositely arranged domains. FIG. 3a shows a so-termed annular or hollow domain 6 and 7 in plate 1 and in plate 2, respectively, these domains being shown in a partly sectional view. The interaction also occurs between different kinds of domains in the two plates. FIG. 3b shows, by way of example, an annular domain 6 in plate 1 and a domain 4 having a circular section (according to FIG. 1) in plate 2. FIG. 3c shows another example: in plate 1 an annular domain 6 is provided and therein a domain 3 having a circular section, while in plate 2 a domain 4 is again provided. FIG. 3d also illustrates that the plates 1 and 2 can be situated at a distance from each other which is equal to zero (d=0). The interaction will then be large. FIG. 3e shows, by way of example, not one but two first plates 1 and 1'. In this case the second plate 2 is provided between 1 and 1'. Domains 3 and 4 are shown, domain 4 notably exerting an influence on both domain 3 in plate 1 and domain 3 in plate 1', thus creating stable domain positions therein at the area of the domains 3.

It is to be noted that the general term domain is to be understood to mean explicity any shape of domains, such as domains having a circular, annular, strip-like etc. section, FIG. 3f shows another example of a strip-like domain 8 in a plate 2. This does not result in one but two stable domain positions in plate 1, i.e. in this configuration at the area where domains 3 and 3' are situated. As a result of the interaction, the stip-like domain 8 broadens somewhat at its ends.

A configuration as shown in FIG. 3f is interesting as the length of the strip domain 8 can be varied with the field transverse to the plates, so that at the same time the distance between the domains 3 and 3' is varied. This distance can now be many times smaller than in the absence of the plate 2 since domains 3 and 3' in one and the same plate repel each other. Another advantage of this configuration is that the distance variation is effected by a very small field variation as the length of this strip was found to be very sensitive to a field variation.

Figure 4A:
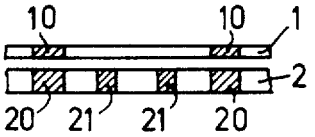
Figure 4B:
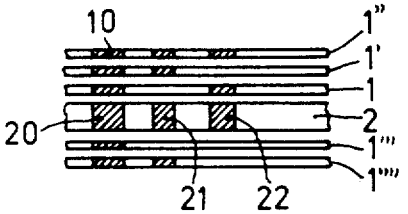

FIGS. 4a and 4b show examples of a plurality of domains in a plurality of plates 1 and 2. Moreover, the thicknesses of the plates are different, by way of example. In particular, plate 2 is thicker than the plates 1,1', 1'', 1''' and 1'''' (FIG. 4b). This can be advantageous in practice as the interaction can then readily be so large that in the first plate 1 domains can exist only at the areas where, viewed in projection, domains are present in the second plate 2. It is thus precluded that domains can also be present at other locations in plate 1. In FIG. 4a the plate 1 has domains 10 where domains 20 are provided in plate 2. Plate 2 also comprises domains 21 above which there are no domains in plate 1. This can be determined by the information pattern present in plate 1. FIG. 4a also shows that the dimensions of domains 20 and 21 in plate 2 differ. This is dependent on whether or not a domain faces a domain 10 in plate 1 so that interaction occurs. This is also visible in FIG. 4b; in plate 2, being thicker than plates 1, 1', 1'', 1''' and 1'''' and being arranged therebetween, the domain dimensions of domains 20, 21 and 22 are also dependent on the presence or absence of domains 10 in the various plates 1, 1', 1'', 1''' and 1''''. The FIG. 4b shows that, particularly in the case of a thick plate 2, a number of thinner plates 1 can be "looked after" by such a second plate 2. Consequently, one second plate 2 can create stable domain positions in a plurality of first plates 1 (1', 1'', 1''' and 1'''').

As described any other feasible configurations can be used to good advantage in magnetic devices according to the invention where it is necessary to displace domains.

A number of domain displacement means are known, for example, domain guiding structures in the form of patterns of wire loops through which a pulse current is fed which takes along the domains from loop to loop, or structures of permalloy in a variety of shapes (for example, T-bars or Y-bars), where a magnetic field, rotating in the plane of a said plate of magnetic material, provides the transport of the domains, or structures such as a so-termed angelfish structure in which a magnetic field of varying dimensions, extending transverse to the plate, provides the transport of the domains in the direction of the structure. In given cases it is already sufficient to use strips of permalloy (tape-like) along which the domains are transported, for example, by means of a small external field which is displaced. In the following examples use is made of the said means, which are not elaborated upon further than is necessary for understanding the present invention. Domain guiding structures are denoted in the examples by broken lines and may have any known shape.

Figure 5A:
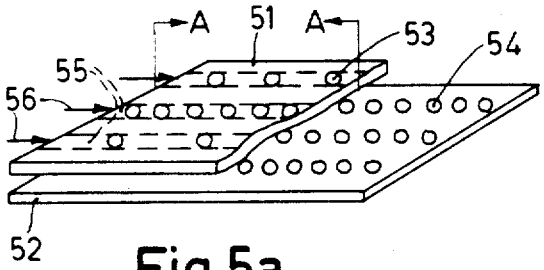
Figure 5B:
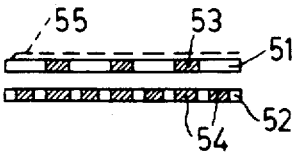

In FIGS. 5a and 5b, FIG. 5b being a sectional view of FIG. 5a along the line A—A, a device is shown in which a first plate 51 comprises domains 53 and a second plate 52 comprises domains 54. Moreover, the first plate 51 comprises structures 55 along which the domains 53 can be transported (see above). Also provided are inputs 56 on which the domains 53 can be generated or be supplied from elsewhere in known manner. Discharging and/or detection of domains can be effected on the right hand side of the plate. This generation or supply can be determined by given information which is transported or stored in the form of domains in plate 1. This results in a pattern of domains 53 in plate 51 which is given by way of example. The plate 52 according to the invention serves to define stable domain positions for plate 51. In this example plate 52 is completely filled with domains 54 which are arranged according to a regular pattern. This can be readily achieved by creating a sufficient number of domains in the plate under given conditions, for example, field strength and plate thickness. The modulation of the magnetic field in which the plate is situated can be an aid in achieving this regular pattern. A stable domain position is defined in plate 51 above each domain 54 in plate 52. This means that, independent of small deviations of the domain guiding structures on the plate 51 and also independent of material deviations (isotropic) in plate 51, a properly defined domain pattern of domains 53 can exist in plate 51. When these domains 53 are displaced, in which case the interaction force with a domain 54 has to be temporarily overcome by means of the displacement means, this displacement can be effected very regularly between the defined stable domain positions. An interesting aspect is that different concepts are possible under different circumstances. For example, if a device according to the invention serves exclusively for the transport of information during given periods, it is possible to make the interaction between domains 53 and 54 disappear by making the domains 54 disappear. If such a device serves mainly as a storage device during another period, the plate 52 can be filled again with domains 54, and so on. An important advantage of this kind of arrangement is that it is possible to operate without an external magnetic field (see field H in FIG. 1) as the domains can maintain each other by interaction. A complete filling as that of plate 52 in itself is very stable and the effect of the stray field of each domain 54 on plate 51 is such that in this plate 51 domains 53 can exist without a separate external magnetic field being required.

Figure 6A:
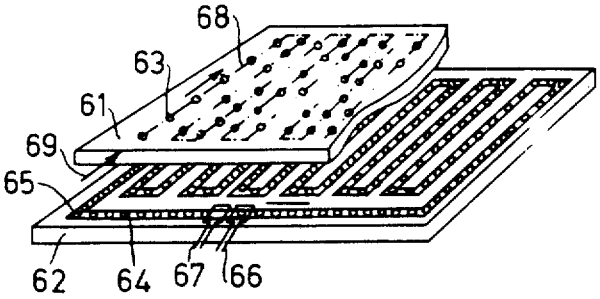
Figure 6B:
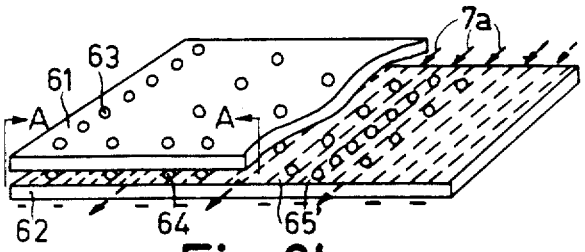
Figure 6C:
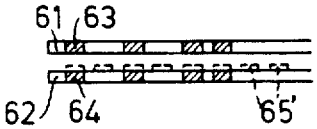
Figure 6D:
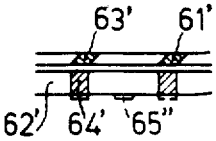

FIGS. 6a and 6b show devices according to the invention in which a first plate 61 comprises domains 63 and a second plate 62 comprises domains 64, FIGS. 6c and 6d showing a feasible section along the line A—A of FIG. 6b. In FIG. 6a plate 62 has a domain guiding structure 65 which is a closed loop for transporting domains 64 therealong. In this case the structure 65 is completely filled with domains 64 which can circulate together along the loop. It is possible to make the domain guiding structure simply on a permalloy strip (tape-like) and to effect the transport therealong by a pull-push action. This can be readily realized, for example, by providing a number of wire loops 66, 67 at one or more locations along the trajectory 65. A given pattern of pulses through these groups will result in a forced transport of domains in a given direction (see, for example "Electronics", Sept. 1st 1969, page 85). In the FIG. 6a the transport direction is assumed to extend to the left.

If desired, the said loops 66 and 67 can also be provided at a plurality of locations along 65. This trajectory 65, completely filled with domains 64, creates, in as far as it is covered by plate 61, displaceable stable domain positions 63 in this plate 61. This displacement will then be effected according to a trajectory 68 (stroke-dot line) which is the projection of traject 65 onto plate 61. Information in the form of domains 63 can then be applied to a point 69 of plate 61. A bit 0 is then, for example, a domain 63, and a bit 1 is the absence of a domain. As a result of the interaction between domains 63 and domains 64, this information is thus transported on plate 61. If the circulation of domains 64 in plate 62 is stopped at a given instant, the information in plate 61 stands still. Discharging or detection of information can be effected on the righthand side of plate 61. In this way a device for transporting and retaining information in the form of domains is realized which is very simple and which does neither require any domain guiding structures of a special shape (T-bars, Y-bars etc) nor varying or rotating magnetic fields. Consequently, the information-carrying plate 61 does not even have to comprise a simple domain guiding structure such as the guide trajectory 65 for plate 62. If the interaction is sufficiently large, it will also be possible to omit the main field for the magnetization (field H in FIG. 1) in such a device. It is to be noted that other configurations in which, for example, the information can be applied to a number of points 69 in known manner and in which the trajectory 65 is subdivided into a number of independent trajectories 65, are of course also possible within the scope of the invention.

In FIG. 6b (and 6c which is a sectional view) a slightly modified device is shown. This device comprises domain guiding structures 65' which are arranged in parallel on plate 62. On points 70 information in the form of "domain present" and "domain absent" (1-bit, 0-bit) is applied to the structure 65' and is transported therealong. This means that in the plate 62 itself, defining the stable positions, a given information pattern can be transported or stored. In plate 61 the domains 63 will take in positions which result in the same information pattern. Consequently, the information in plate 62 is copied to plate 61. This is advantageous in cases where information is collected in a plate 62, after which it must be applied to one or even more than one second plate in one operation.

The said possibility of coyping is also useful in cases where, for example, the magnetic material of plate 61 is quite suitable for displaying the information pattern, for example, by means of light, but not very suitable for transporting the information also in the plate by means of domain displacement means. If the material of plate 62 is very suitable for this transport with the aid of displacement means, but not very suitable for the reading out or displaying of the information pattern by means of light, a combination of two of such plates 61 and 62 is useful due to the interaction forces occurring therebetween. Such a case can be illustrated as follows. A domain pattern can be made visible by using the Faraday effect. A domain causes a rotation of the polarization plane of transmitted light and detection of this rotation results in an image of the domain pattern. It is known that the rotation of the polarization plane is large if a plate of magnetic material is cut at right angles to the optical axis instead of cutting such a plate from a crystal at right angles to the preferred direction of the magnetization. The rotation of the polarization plane can thus be a factor $10^3$ higher as double refraction no longer occurs upon transmission of light. However, the behaviour of such a plate, in this case, for example, 61' in FIG. 6c which is obtained by a cut perpendicular to the optical axis, is different with regard to domains than that of a plate obtained by a cut perpendicular to the preferred direction of magnetization. The domains 63' will be in a tilted position and will be difficult to displace. If a second plate 62' (FIG. 6c) is obtained by a cut perpendicular to the preferred direction of the magnetization and the displacement of domains 64' therein by means of structures 65'' imposes no problems, the displacement of the domains 63' in plate 61' can be realized by the interaction occurring from plate 62'. This interaction can readily be so large, inter alia by choosing the distance between the plates 61' and 62' to be small and the plate 62' to be thicker, that the taking along of domains 63' in plate 61' by the domain 64' in plate 62' is always ensured.

Figure 7:
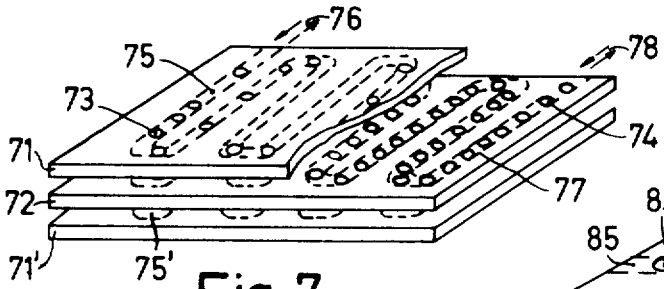

FIG. 7 shows an example of a device according to the invention in which domain guiding structures are provided for domains in a first as well as for domains in a second plate. A first plate 71, and in this case also another first plate 71', by way of example, has a structure 75, 75', respectively, along which domains 73 can be displaced. Denoted by the reference 76 is a supply/discharge location for domains. A second domain 72 also has a structure, i.e. 77, along which domains 74 can be displaced. In plate 72, for example, the complete structure 77 is occupied with domains, so that it creates stable domain positions for positions along the guide structures 75 and 75' in the plates 71 and 71', respectively, said stable domain positions also being displaceable. In plate 71 (71') a given information pattern is provided or is stored therein. The following can be achieved by means of this configuration: if information is to be transported in plate 1, this can be effected without rotating or varying external fields being necessary. The domain guiding structures 75 and 75' can be simple permalloy strips, special shapes not being necessary. The reason for this is that information in plate 71, arranged in the form of the structure 75, can be taken along by the displaceable domains 74 in plate 72. The complete pattern of stable domain positions is thus capable, as a result of its displaceability in plate 72, of performing a desired transport in the information-carrying plate 71 (71'). The displacement of the domains in plate 72 itself can then also be readily effected since the complete filling along a structure 77, which can also consist simply of straight strips of permalloy, makes it possible to transport the domains 74 in plate 72, for example, by generating a domain each time at the beginning (78, for travel in the one direction) of such a structure and by making a domain disappear at the end (78, for travel in the other direction) of such a structure. The complete filling is thus shifted further in its entirety. It is alternatively possible to provide the plate 72 with a closed transport loop so that always the same shifting domains are used. See the description given with reference to FIG. 6a in view of the guiding trajectory 65 and the push-pull movement for the regular shifting of domains along a trajectory with a complete filling.

Figure 8:
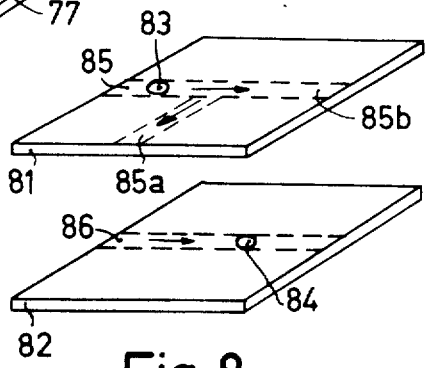

FIG. 8 shows an interesting example of the application of the interaction between domains in a first plate 81 and a second plate 82. A domain in plate 81 can be transported along a structure 85. The structure branches into two trajectories 85a and 85b. Assume that in the case of a displacement a domain 83 would normally proceed from 85 to 85a (see hereinafter). Plate 82 comprises a domain 84 which is also displaceable, in this case, for example, along a structure 86. Using this arrangement a domain 83 in plate 81 can be controlled by means of a domain 84 in plate 82. If domain 84 is in the position shown in FIG. 8, a domain 83 will follow the trajectory 85b instead of the said trajectory 85a. This is due to the fact that interaction occurs between the domains 83 and 84.

Figure 9:
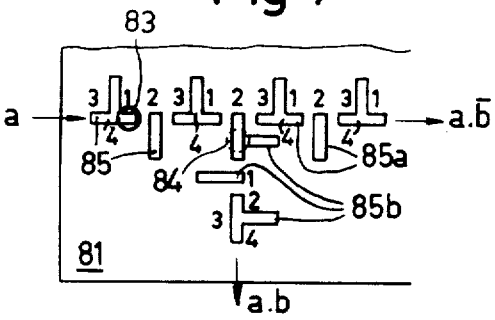
Figure 10:
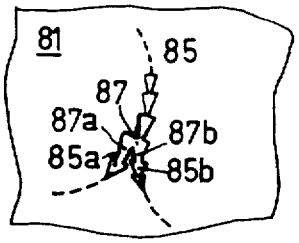

FIGS. 9 and 10 illustrate such a branching of structures 85, 85a and 85b, respectively.

FIG. 9 shows a T-bar structure along which a domain can be displaced, by means of a field rotating in the plane of the plate 81, along poles which are denoted by 1, 2, 3, 4, 1, 2, . . . . A domain 83 which is supplied at a will normally proceed from left to right to output a.b. If a domain 84 (shown in broken lines again in FIG. 9) in a plate 82 (not shown, compare FIG. 8) passes the branching point of the drawing from the top downwards, or is, for example, in the position shown, a domain 83 is deflected and arrives on the output which is denoted by a.b. In this manner a switch is created for a series of domains. See further hereinafter.

FIG. 10 shows an angelfish structure. Due to a varying field which extends transverse to the plane of a plate 81, a domain will normally travel along 85 to 85a. The element 87 of the structure is somewhat asymmetrical, i.e. a point 87b is smaller than point 87a. A domain will normally move via point 87a, but of a domain is present in the vicinity if point 87b, i.e. in particular not on the side of 87a in a plate 82 (see FIG. 8), this domain will ensure that the domain in plate 81 is transported further in the direction of the structure 85b.

It will be obvious that logic functions can be realized using such a form of control of domains. This follows immediately from the drawing of FIG. 9; for example: provided are an input a, and outputs a.b. and a.$\bar{b}$. It is thus indicated that by means of this configuration (FIG. 9 in relation with FIG. 8) two logic operations can be realized, i.e. a.b. and a.$\bar{b}$. This follows from: if a domain 83 arrives at input a, this domain will arrive at output a.b. only if said domain 84 in the second plate 82 arrives at or passes the position underneath plate 81 shown in FIG. 9. This represents the function a.b. if said presence of domain 84 is denoted by b. If no domain 84 arrives, i.e. "not present", so $\bar{b}$, domain 83 in plate 81 moves from input a to output a.$\bar{b}$. This means that there is a, but not b: a.$\bar{b}$.

Figure 11:
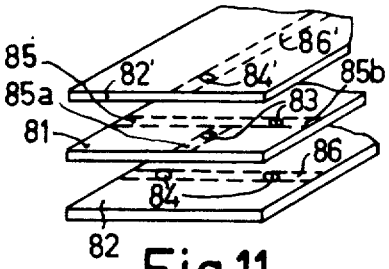

It is to be noted that structures as shown in FIG. 9 and 10 are not necessary if an arrangement is chosen where the plate 81 is arranged between plates 82 and 82'. See FIG. 11. A domain 84 in plate 82, travelling along a structure 86, sends a domain 83 in plate 81 to one side, and a domain 84' in plate 82' travelling along a structure 86' sends a domain 83 in plate 81 to the other side. In this case a permalloy conductor 85 (a.b.) already suffice; this conductor need not have a special shape and no varying or rotating field is necessary.

Figure 12:
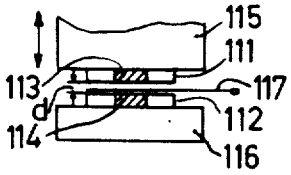
FIG. 12 shows an example of a first and a second plate according to the invention which are displaceable with respect to each other.

FIG. 12 shows an example of two plates 111 and 112 according to the invention which are displaceable with respect to each other. Plate 111 is mounted, for example, on a component 115, the displacements of which with respect to a component 116 have to be measured. A domain 113 in plate 111 and a domain 114 in plate 112 influence each other. The dimensions vary in accordance with the variation of the distance d between the plates 111 and 112. A wire loop 117 at the area of domain 114 can serve for conversion of the dimensional variation into an electrical signal. If a permalloy foil is provided at the area of, for example, the domain 114, it is also possible to measure the electrical resistance of the permalloy so as to detect the dimensional variation of the domain which causes the resistance variation.

Other applications are feasible, for example, in the conversion of acoustic vibrations into electrical signals etc. The reverse operation is of course also possible. In that case the plate 111 can be put into motion by a variation of the dimensions of the domain 114 by a current variation in, for example, a wire loop 117 and hence by a variation in the interaction force between domains 113 and 114.

Figure 13:
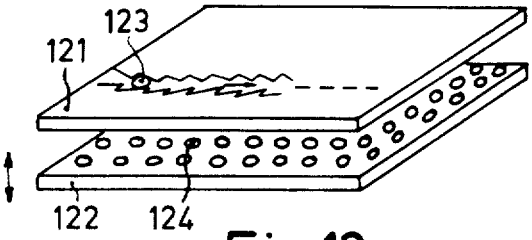
FIG. 13 shows an example of plates according to the invention which are displaceable with respect to each other, a domain guiding structure being provided for at least one of the plates.

FIG. 13 shows another example of plates according to the invention which are displaceable with respect to each other. Plates 121 and 122 are displaceable with respect to each other. A domain 123 in plate 121 is displaceable along an angelfish structure which is given by way of example. Plate 122 comprises domains 124 which, by way of example, completely fill the plate 122 (compare plate 52 of FIG. 5). As a result of the displacement of the plates with respect to each other, notably transverse to the planes of the plates, the dimensions of domains 123 (and 124) will vary. Using this dimensional variation, a domain 123 is displaced in this example in the direction of the angelfish structure.

It is to be noted that the displacement of the plates with respect to each other need not be exclusively transverse to the plane of the plates. A displacement in the plane of the plates also produces a variation in the interaction between domains in a first and a second plate. Applications involving operation in a corresponding manner can thus also be realized.

What is claimed is:

1. A magnetic device comprising a first plate of a magnetic material in which at least one domain is present, a domain guiding structure having a plurality of continuous branched connecting paths for the displacement of the domain in the first plate, a second plate of magnetic material in which a domain is present, said second plate covering, at least in projection, at least a part of the first plate, an interaction force occurring between at least one domain in the first and one domain in the second plate, and a domain guiding structure having at least one path for the displacement of a domain in the second plate which controls the displacement of the domain in the first plate along one of said paths therein.

2. A magnetic device as claimed in claim 1 including means to vary the distance between the plates whereby the dimensions of the domains can be varied.

3. A magnetic device as claimed in claim 1 including means to vary a dimension of a domain in the second plate whereby the domain is displaceable in the direction of the guiding structure.

*4. A magnetic device comprising a first plate of a magnetic material in which at least one domain is present, a domain guiding structure having a plurality of guiding paths for the displacement of domains in the first plate, and a second plate of magnetic material completely filled with domains, said second domain covering, at least in projection, at least a part of the first plate, an interaction force occurring between at least one domain in the first and one domain in the second plate, the domains in the second plate creating stable positions for the domains in the first plate.*

*5. A magnetic device as claimed in claim 4 including a domain guiding structure for displacing domains in the second plate according to a given trajectory, said displaceable domains in the second plate defining displaceable stable domain positions in the first plate.*

*6. A magnetic device as claimed in claim 5 wherein the guiding structure in the second plate is a closed loop.*

*7. A magnetic device as claimed in claim 4 including domain guiding structures for displacing domains in the first and second plate according to given trajectories, a displacement of a domain in the second plate causing and controlling a displacement of domains according to one of the trajectories in the first plate.*

*8. A magnetic device as claimed in claim 4, wherein said first and second plate are displaceable with respect to each other so that the dimensions of the domains in the plate can be varied.*

*9. A magnetic device as claimed in claim 4, including a structure for guiding domains in at least one of the plates, and said first and second plate are displaceable with respect to each other, a domain being displaceable in the direction of said guiding structure as a result of a dimensional variation of a domain.*

*10. A magnetic device as claimed in claim 4 wherein the second plate comprises a strip domain by which stable domain positions are defined in the first plate at the area of the projection of the ends of said strip domain.*

*11. An apparatus using magnetic bubble domains comprising:*

*a first magnetic medium containing a lattice of magnetic bubble domains; and*

*a second magnetic medium containing an information bit pattern of bubble domains and the absences of bubble domains, said second magnetic medium being arranged near and over the first magnetic medium so that the bubble domains in the second magnetic medium are magnetically coupled to bubble domains in the first magnetic medium, movement of the lattice of bubble domains in the first magnetic medium thereby causing movement of the information bit pattern of bubble domains in the second magnetic medium by said magnetic coupling.*

*12. An apparatus using magnetic bubble domains, comprising:*

*a first magnetic medium and confinement means for confining domains therein in a two-dimensional lattice of interacting bubble domains, the interdomain spacings in said lattice being substantially determined by interactions between said domains and by said confinement means,*

*a second magnetic medium,*

*means for producing an information bit pattern of bubble domains and voids in said second magnetic medium in positions where said bubble domains in said second magnetic medium are magnetically coupled to bubble domains in said first magnetic medium, the spacings between said bits in said second medium being substantially determined by the interdomain spacings in said lattice,*

*means for moving said bubble domains in said information bit pattern, comprising further means for moving domains in said lattice to thereby move said information bit pattern of domains by said magnetic coupling, and*

*means for sensing said bubble domains in said second magnetic medium.*

*13. An apparatus using magnetic bubble domains, comprising:*

*a first magnetic medium and a confinement means for confining a two-dimensional lattice of columns of magnetic bubble domains therein, the positions of bubble domains within said lattice being substantially determined by interactions therebetween, and by said confinement means,*

*a second magnetic medium with a coded pattern of magnetic bubble domains therein which are magnetically coupled to domains in said lattice, each said domain in said coded pattern being coupled to a different one of said domains in said lattice,*

*means for moving columns of bubble domains in said lattice, to thereby drag columns of magnetically coupled bubble domains in said coded pattern,*

*means for producing said coded patten of bubble domains in said second magnetic medium,*

*means for sensing bubble domains in said coded pattern of bubble domains.*

* * * * *